United States Patent
Paul et al.

(10) Patent No.: US 9,678,181 B2
(45) Date of Patent: Jun. 13, 2017

(54) AUTOMATIC POSITIONING AND ADAPTATION IN AN ADJUSTMENT FOR A SHIM FIELD MAP

(71) Applicants: Dominik Paul, Bebenreuth (DE); Benjamin Schmitt, Nürnberg (DE)

(72) Inventors: Dominik Paul, Bebenreuth (DE); Benjamin Schmitt, Nürnberg (DE)

(73) Assignee: Siemens Aktiengesellschaft, München (DE)

( * ) Notice: Subject to any disclaimer, the term of this patent is extended or adjusted under 35 U.S.C. 154(b) by 1028 days.

(21) Appl. No.: 13/896,891

(22) Filed: May 17, 2013

(65) Prior Publication Data

US 2013/0307541 A1 Nov. 21, 2013

(30) Foreign Application Priority Data

May 18, 2012 (DE) .......................... 10 2012 208 325

(51) Int. Cl.
*G01R 33/36* (2006.01)
*G01R 33/58* (2006.01)
*G01R 33/3875* (2006.01)
*G01R 33/565* (2006.01)

(52) U.S. Cl.
CPC ......... *G01R 33/36* (2013.01); *G01R 33/3875* (2013.01); *G01R 33/5659* (2013.01); *G01R 33/58* (2013.01)

(58) Field of Classification Search
USPC .................. 324/300–322; 600/407–435; 382/128–131
See application file for complete search history.

(56) References Cited

U.S. PATENT DOCUMENTS

| | | | |
|---|---|---|---|
| 4,899,109 A | 2/1990 | Tropp et al. | 324/320 |
| 6,943,551 B2 | 9/2005 | Eberler et al. | 324/318 |
| 7,548,061 B2 | 6/2009 | Dewdney et al. | 324/309 |
| 2003/0173965 A1 | 9/2003 | Oesingmann | |
| 2005/0038336 A1 | 2/2005 | Nimsky | |
| 2005/0264286 A1 | 12/2005 | Harder | |
| 2006/0182219 A1 | 8/2006 | Levy | |
| 2007/0222451 A1* | 9/2007 | Feltham | G01R 33/3873 324/320 |

(Continued)

FOREIGN PATENT DOCUMENTS

| | | |
|---|---|---|
| CN | 1435155 A | 8/2003 |
| CN | 1550208 A | 12/2004 |

(Continued)

OTHER PUBLICATIONS

Korean Office action for related Korean Application No. 10 2013 0054979, dated Oct. 27, 2015, with English Translation.

(Continued)

*Primary Examiner* — Melissa Koval
*Assistant Examiner* — Tiffany Fetzner
(74) *Attorney, Agent, or Firm* — Lempia Summerfield Katz LLC

(57) ABSTRACT

A method for shimming a magnetic field in a magnetic resonance tomography (MRT) device includes determining a field of view region for an object under examination. Determining the field of view region includes adapting the field of view region automatically to a region of the object under examination to be examined by the MRT device. Before the MRT device records an image, an adjustment measurement of the magnetic field is performed. A field map of the magnetic field of the field of view region is defined based on the adjustment measurement. A shimming of the magnetic field is implemented based on the field map.

15 Claims, 2 Drawing Sheets

(56) References Cited

U.S. PATENT DOCUMENTS

| | | |
|---|---|---|
| 2008/0231280 A1 | 9/2008 | Greim et al. |
| 2011/0050229 A1 | 3/2011 | Chen et al. |
| 2011/0172515 A1 | 7/2011 | Fautz et al. |
| 2011/0228998 A1* | 9/2011 | Vaidya ................. G01R 33/543 382/131 |
| 2013/0249553 A1* | 9/2013 | Simonetti .......... G01R 33/4828 324/309 |
| 2013/0307541 A1* | 11/2013 | Paul ....................... G01R 33/36 324/318 |

FOREIGN PATENT DOCUMENTS

| | | |
|---|---|---|
| CN | 1715945 A | 1/2006 |
| CN | 101120246 A | 2/2008 |
| CN | 101271150 A | 9/2008 |
| CN | 101427146 A | 5/2009 |
| CN | 101995560 A | 3/2011 |
| DE | 10314215 B4 | 11/2006 |
| DE | 102007009203 | 8/2008 |
| WO | WO0346598 A1 | 6/2003 |
| WO | WO2005010544 A1 | 2/2005 |

OTHER PUBLICATIONS

German Office Action dated Jan. 11, 2013 for corresponding German Patent Application No. DE 10 2012 208 325.1 with English translation.
Chinese office Action for related Chinese Application No. 201310163427.9 dated Feb. 2, 2016, with English Translation.

* cited by examiner

AUTOMATIC POSITIONING AND ADAPTATION IN AN ADJUSTMENT FOR A SHIM FIELD MAP

This application claims the benefit of DE 102012208325.1, filed on May 18, 2012, which is hereby incorporated by reference.

BACKGROUND

The present embodiments relate to methods and devices for shimming a magnetic field in a magnetic resonance tomography (MRT) device.

Magnetic resonance tomographs for examination of objects or patients by magnetic resonance tomography are known, for example, from DE10314215B4.

SUMMARY

The scope of the present invention is defined solely by the appended claims and is not affected to any degree by the statements within this summary.

The present embodiments may obviate one or more of the drawbacks or limitations in the related art. For example, methods and devices for shimming a magnetic field are optimized.

DETAILED DESCRIPTION

One or more of the present embodiments relate to methods and devices for shimming a magnetic field in a magnetic resonance tomography device. Automatic positioning and adaptation may be implemented in an adjustment method for a shim field map based on automatic positioning (e.g., AutoAlign) and/or automatic coverage setting (e.g., AutoCoverage) functionality.

Figure 2:
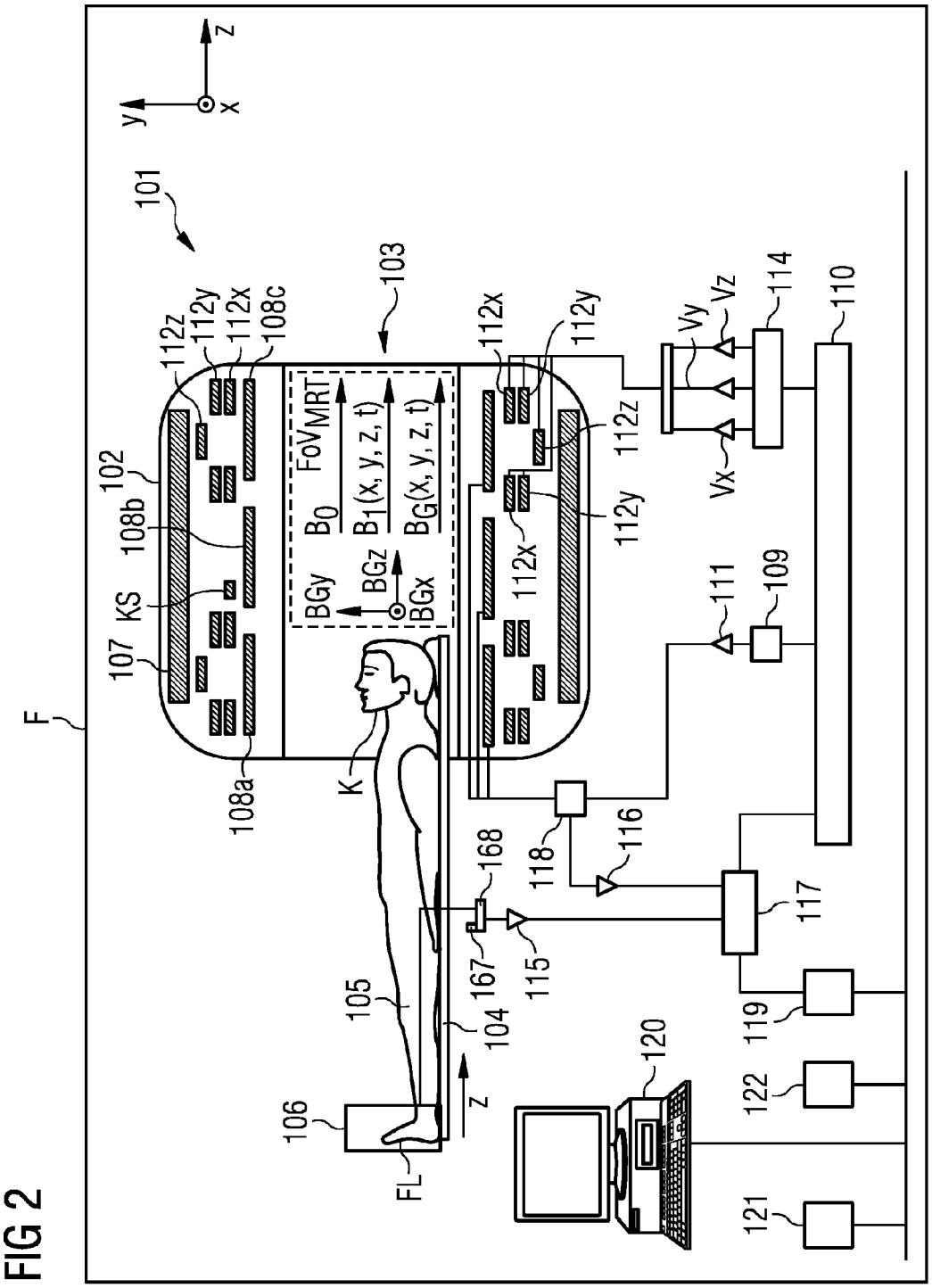
FIG. 2 shows one embodiment of an MRT device for use with the local coil of FIG. 1.

FIG. 2 shows an imaging magnetic resonance tomography (MRT) device 101 (e.g., located in a shielded room or Faraday cage F) with a whole body coil 102 with a tubular space 103, in which a patient couch 104 with a body 105 (e.g., of an object to be examined such as a patient) 105 with or without local coil arrangement 106 may be moved in the direction of the arrow z to generate images of the patient 105 using an imaging method. The local coil arrangement 106, which may be used to generate images of a part area of the body in the field of view FoV2, FoV3 in a local area or region (e.g., a field of view FoV2, FoV3 having a maximum size dimension DXFoV, DYFoV of the MRT field of view FoV) of the MRT, may be arranged on the patient. Signals from the local coil arrangement 106 may be evaluated (e.g. converted into images, stored or displayed) by an evaluation device (e.g., the evaluation device 168, 115, 117, 119, 120, or 121) of the MRT device 101. The evaluation device may be connected to the local coil arrangement 106 via, for example, coaxial cable or wireless connection 167.

In order to examine a body 105 (e.g., an object to be examined or a patient) with magnetic resonance imaging using the MRT device 101, different magnetic fields, which are matched (e.g., tuned) to one another as precisely as possible with respect to temporal and spatial characteristics, are radiated into the body 105. A strong magnet (e.g., a cryomagnet 107) in a measurement chamber (e.g., with a tunnel shaped opening 103) creates a strong static main magnetic field B0 (e.g., measuring between 0.2 Tesla and 3 Tesla or more than 3 Tesla). The body 105 to be examined is moved, supported on a patient couch 104, into a roughly homogeneous area (e.g., region) of the main magnetic field B0 in the field of view area FoV2, FoV3 (e.g., field of view (FOV) or field of view region). Atomic nuclei of the body 105 are excited into nuclear resonance by magnetic high-frequency excitation pulses B1 (x, y, z, t) radiated into the nuclei via a high-frequency antenna shown in simplified form as a body coil 108 (e.g., a multipart coil 108a, 108b, 108c) and/or a local coil arrangement. High-frequency excitation pulses are generated by, for example, a pulse generation unit 109 that is controlled by a pulse sequence control unit 110. After the high-frequency pulses are amplified by a high-frequency amplifier 111, the high-frequency pulses are guided to the high-frequency antenna 108. The system shown in FIG. 2 is exemplary. In other embodiments, more than one pulse generation unit 109, more than one high-frequency amplifier 111 and a number of high-frequency antennas 108a, 108b, 108c may be used in the MRT device 101.

The MR device 101 further includes gradient coils 112x, 112y, 112z, with which magnetic gradient fields BG(x, y, z, t) are radiated (e.g., beamed in) during a measurement for selective slice excitation and for local encoding of the measurement signal. The gradient coils 112x, 112y, 112z are controlled by a gradient coil control unit 114 that, like the pulse generation unit 109, is connected to the pulse sequence control unit 110.

Signals transmitted by the nuclear resonance of the excited atomic nuclei in the object under examination are received by the body coil 108 and/or at least one local coil arrangement 106, amplified by assigned high-frequency preamplifiers 116 and further processed and digitized by a receiver unit 117. The recorded measurement data is digitized and stored as complex numerical values in a k-space matrix. An associated MR image may be reconstructed from the k-space matrix containing numerical values by, for example, a multidimensional Fourier transformation.

For a coil that may be operated in both the transmit mode and the receive mode, such as, for example, the body coil 108 or a local coil 106, correct signal forwarding is regulated by an upstream transceiver branch 118.

An image processing unit 119 creates an image from the measurement data. The image is displayed via an operating console 120 to a user and/or is stored in a memory unit 121. A central processor unit 122 controls the individual components of the system.

In MR tomography, images with a high signal-to-noise ratio (SNR) may be recorded with local coil arrangements. The local coil arrangements are antenna systems that are attached in the immediate vicinity at (e.g., anteriorly) or below (e.g., posteriorly), on, or in the body 105. During an MR measurement, the excited nuclei induce a voltage in the individual antennas of the local coil. The induced voltage is amplified by a low-noise preamplifier (e.g., LNA, preamp) and forwarded to the receive electronics. To improve the signal-to-noise ratio, even for high-resolution images, high-field systems are used (e.g., from 1.5 Tesla to 12 Tesla or more). If a number of individual antennas that may be connected to an MR receive system exceeds a number of available receivers, a switching matrix (e.g., RCCS) is installed (e.g., integrated) between the receive antennas and the receivers. The switching matrix routes the currently active receive channels (e.g., the receive channels currently located in the field of view of the magnet) to the available receivers. As such, more coil elements may be connected than there are receivers available, because, with respect to whole body coverage, only the coils that are located in the FoV2, FoV3 (FOV) or in the homogeneity volume of the magnet are to be read out.

In some embodiments, the local coil arrangement 106 is configured as an antenna system that may include one or, as an array coil, a number of antenna elements (e.g., coil elements). The individual antenna elements are, for example, configured as loop antennas (e.g., loops), butterfly coils, flex coils or saddle coils. The local coil arrangement 106 may include coil elements, a preamplifier, further electronics (e.g., sheath current filters), a housing, supports, and a cable with a plug, through which the local coil arrangement 106 is connected to the MRT system. A receiver 168 attached to the MRT system side filters and digitizes a signal received (e.g., wirelessly) from the local coil 106 and transfers the data to a digital signal processing device. The digital signal processing device derives an image or a spectrum from the data obtained by a measurement and makes the image or the spectrum available to a user for, for example, subsequent diagnosis by the user and/or for storage.

Figure 1:
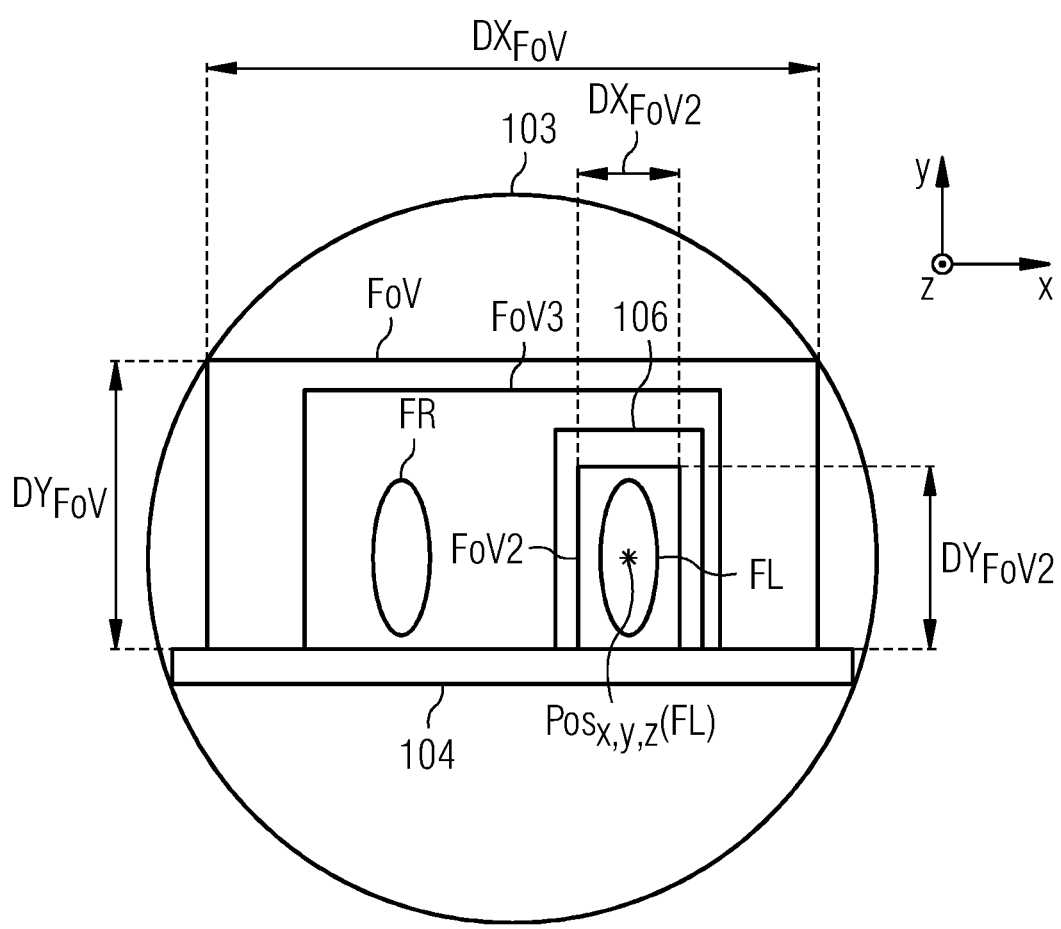
FIG. 1 shows a local coil disposed on an MRT patient bed to depict field map sequence calibration areas automatically adapted in position and size to a patient foot to be examined in accordance with one embodiment.

FIG. 1 shows a simplified, cross-sectional schematic view of the local coil 106 (e.g., foot coil) in an MRT bore 103. The local coil 106 is disposed on a patient couch 104 on one foot FL of a pair of feet FR, FL of a patient in an image measurement area or other field of view area FoV of an MRT device. FIG. 1 also shows exemplary field map sequence calibration areas automatically matched in position and/or size to the area under examination (e.g., for the foot FL). For example, the field map sequence calibration areas correspond in size with or include a field of view area FoV2, FoV3 for an object under examination. Before an image of the area under examination is recorded with the MRT device, an adjustment measurement of a magnetic field (e.g., B0 and/or B1) is performed. Based on the results of the adjustment measurement, in a field map sequence calibration area adapted to the object under examination (e.g., the foot FL) in accordance with an examination object-specific field of view area FoV2 or FoV3, a field map (e.g., a magnetic field distribution map) of the field of view area FoV2 or FoV3 is determined. For example, the field map sequence calibration region may be adapted in position and/or size to the object under examination. The field map sequence calibration region may also be adapted in resolution to the size of the field of view area FoV2 or FoV3. A shim correction of a magnetic field (B0 and/or B1) is undertaken at least in the field of view area FoV2 or FoV3 based on the field map.

A shim may be a magnetic field correction of a spatially uneven magnetic field by elements passively changing the magnetic field. A shim may alternatively or additionally be a magnetic field correction by changing the magnetic field with a shim field generated by coils (e.g., shim coils, HF coils, gradient coils). The shim field changes the uneven magnetic field. For example, the shim field may make the magnetic field more even.

With known (e.g., conventional) adjustment measurements of the magnetic field (B0 and/or B1) in an MRT device 101, a field map (e.g., magnetic field distribution map) is determined in a field calibration area in accordance with the complete (e.g., maximum) measurement area (Field of View, FoV) of an MRT scanner 101 from the results of the adjustment measurement. The field map may be determined for optimizing the homogeneity of the magnetic field (B0 and/or B1) (e.g., by shim correction of the measured magnetic field). The field map is determined to provide that at least the entire body area to be examined (e.g., the foot FL), to be examined around the position Pos x,y,z(FL) is to be recorded independently of position and spatial extent. This may provide that the imaging parameterization used represents a compromise between measurement time and resolution.

For examinations of small objects (e.g., extremities or the head), in which only a small part of the field of view FoV is filled by the region of the body to be examined, a reduced FoV is useful for the measurement of the field map because this makes a higher spatial resolution possible within the part of the extremity being examined. In addition, the position of the object may not automatically be unique, because of the variable coil position of the local coil 106 and/or because of selection of either the left or right side of the patient. The problem has previously been addressed by a known procedure, so that the field of view FoV has been selected large enough to safely cover all possible measurable areas.

In accordance with one embodiment, a local field map protocol for a shim adjustment uses automatic positioning (e.g., AutoAlign) information and automatic coverage setting (e.g., AutoCoverage) information, which may record, position and parameterize the MRT device 101 (e.g., the field of view area FoV2, resolution).

The AutoAlign or other automatic positioning information and the AutoCoverage or other automatic coverage setting information may include information with respect to the area to be examined and/or the position and/or size of the local coil 106 and/or of the area to be examined FL. The MRT records and/or uses the information to define the position and/or size (e.g., the extent/edge length in a direction z in the direction in which the patient couch is moved into the bore 103, and/or a direction y vertically and perpendicularly oriented to the direction z, and/or a direction x horizontally and perpendicularly oriented to the direction z) of a field of view (FoV2 or FoV3)). From the field of view FOV2 or FOV3, a field map for the magnetic field is created. MRT imaging is performed for the field of view area (FoV2 or FoV3) with the magnetic field shim.

One or more of the present embodiments may define and use a measurement area FoV2 or FoV3, in which the measurement object FL is entirely disposed, that is relatively smaller than the maximum possible imaging field of view FoV of the MRT scanner 101.

The smaller measurement area enables, for example, more rapid adjustment protocols to be generated or used in connection with the field map, or an increased resolution to be realized for the same measurement time. The increased resolution may have a positive influence on the shim quality. The increased quality of the field map may additionally predictably avoid a number of acquisitions of field maps otherwise used for achieving a sufficiently homogeneous shim.

It is to be understood that the elements and features recited in the appended claims may be combined in different ways to produce new claims that likewise fall within the scope of the present invention. Thus, whereas the dependent claims appended below depend from only a single independent or dependent claim, it is to be understood that these dependent claims can, alternatively, be made to depend in the alternative from any preceding or following claim, whether independent or dependent, and that such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A method of shimming a magnetic field in a magnetic resonance tomography (MRT) device having a local coil, the method comprising:
    determining, by a controller of the MRT device, a field of view area;
    automatically adapting the field of view area to an area of an object under examination;
    determining, by the controller, a shim field map of the field of view area by using automatic positioning information and automatic coverage information including the area of the object under examination and a position of the local coil, wherein the MRT device is configured to use the area of the object under examination and the position of the local coil in order to determine a position, a size, or the position and the size of the field of view area;
    shimming the magnetic field of the field of view area with respect to the object under examination based on the determined shim field map;
    recording, by the MRT device, an image of the object under examination using the shimmed magnetic field; and
    displaying or storing the recorded image.

2. The method as claimed in claim 1, wherein the determining of the field of view area with the controller comprises automatically defining the field of view area whereby the field of view area is adapted in the position, the size, or the position and the size to the area of the object under examination.

3. The method as claimed in claim 2, wherein the field of view area is smaller than a maximum possible field of view area of the MRT device.

4. The method as claimed in claim 2, wherein the field of view area is defined whereby at least an entire area to be examined by the MRT device is contained in the field of view area.

5. The method as claimed in claim 2, wherein the field of view area is defined whereby an edge length of the area of the object under examination fills out at least a predetermined proportion of an edge length of a maximum possible MRT field of view of the MRT device.

6. The method as claimed in claim 2, wherein the field of view area is defined whereby an edge length in a first direction of the area of the object under examination fills out at least 10 percent of an edge length of a maximum possible MRT field of view of the MRT device, and an edge length in a direction of the area of the object under examination perpendicular to the first direction fills out at least 10 percent of an edge length of the maximum possible MRT field of view of the MRT device.

7. The method as claimed in claim 2, wherein the shimming of the magnetic field comprises shimming only in the field of view area.

8. The method as claimed in claim 2, wherein a calibration measurement of the magnetic field in the field of view area in determining the shim field map is:
    (1) an accelerated calibration measurement that is compared to a calibration measurement of the magnetic field in a maximum possible field of view area,
    (2) a calibration measurement with a greater resolution that is compared to the calibration measurement in the maximum possible field of view area, or
    (3) a combination of (1) and (2).

9. A magnetic resonance tomography (MRT) device comprising:
    a local coil;
    a controller configured to:
        define a field of view area taking into account an area of an object under examination to be examined by imaging by the MRT device, wherein the area to be examined is contained in the field of view area; and
        determine a shim field map of the field of view area by using automatic positioning information and automatic coverage information including the area of the object under examination and a position of the local coil, wherein the MRT device is configured to use the area of the object under examination and the position of the local coil in order to determine a position, a size, or the position and the size of the field of view; and
    a shim device configured to shim the magnetic field in the MRT device based on the determined shim field map, wherein the controller is configured to control the shim device based on the determined shim field map, and wherein the MRT device is configured to record an image of the object under examination using the shimmed magnetic field, and display or store the recorded image.

10. The MRT device as claimed in claim 9, wherein the controller is configured to define the field of view area whereby the field of view area is adapted automatically to the area of the object under examination.

11. The MRT device as claimed in claim 10, wherein the controller is configured to define the field of view area whereby the field of view area is automatically adjusted in the position, the size, or the position and the size to the area of the object under examination.

12. The MRT device as claimed in claim 11, wherein the controller is configured to define the field of view area whereby the field of view area is smaller than a maximum field of view area of the MRT device.

13. The MRT device as claimed in claim 11, wherein the controller is configured whereby at least an entire area of the object under examination is in the field of view area.

14. The MRT device as claimed in claim 9, wherein the shim device is configured to perform a shimming only in the field of view area.

15. The MRT device as claimed in claim 9, wherein the controller is configured to determine the shim field map with a calibration measurement of the magnetic field in the field of view area, and
    wherein the calibration measurement is:
    (1) an accelerated calibration measurement that is compared to a calibration measurement of the magnetic field in a maximum possible field of view area,
    (2) a calibration measurement with a greater resolution that is compared to the calibration measurement in the maximum possible field of view area, or
    (3) a combination of (1) and (2).

* * * * *